US012762301B2

(12) United States Patent
Kang et al.

(10) Patent No.: US 12,762,301 B2
(45) Date of Patent: Oct. 13, 2026

(54) ADVANCED TUBULAR DESIGN METHODOLOGY WITH HIGH TEMPERATURE GEOTHERMAL AND OIL/GAS CYCLIC THERMAL LOADING EFFECT

(71) Applicant: Landmark Graphics Corporation, Houston, TX (US)

(72) Inventors: Yongfeng Kang, Houston, TX (US); Robello Samuel, Houston, TX (US); Vagish Kumar, Bangalore (IN)

(73) Assignee: Landmark Graphics Corporation, Houston, TX (US)

( * ) Notice: Subject to any disclaimer, the term of this patent is extended or adjusted under 35 U.S.C. 154(b) by 1252 days.

(21) Appl. No.: 17/592,989

(22) Filed: Feb. 4, 2022

(65) Prior Publication Data

US 2023/0252200 A1 Aug. 10, 2023

(51) Int. Cl.
*G06F 30/18* (2020.01)
*E21B 41/00* (2006.01)
(Continued)

(52) U.S. Cl.
CPC .............. *G06F 30/18* (2020.01); *E21B 41/00* (2013.01); *E21B 47/07* (2020.05); *E21B 17/00* (2013.01); *E21B 2200/20* (2020.05)

(58) Field of Classification Search
CPC ...... G06F 30/18; G06F 30/12; G06F 2111/00; G06F 2119/22; E21B 47/07; E21B 41/00; E21B 2200/20; E21B 17/00
See application file for complete search history.

(56) References Cited

U.S. PATENT DOCUMENTS

| | | | | |
|---|---|---|---|---|
| 11,416,650 | B2 * | 8/2022 | Liu | E21B 43/10 |
| 12,060,787 | B2 * | 8/2024 | Kang | E21B 47/007 |

(Continued)

FOREIGN PATENT DOCUMENTS

| | | | |
|---|---|---|---|
| WO | 2020180306 | A1 | 9/2020 |
| WO | 2021040775 | A1 | 3/2021 |

OTHER PUBLICATIONS

P. V. Suryanarayana, and Ravi. M. Krishnamurthy, "Post-Yield Tubular Design and Material Selection Consideration for improved geometric Well Integrity", Feb. 12-14, 2018, pp. 1-13. (Year: 2018).*

(Continued)

*Primary Examiner* — Kibrom K Gebresilassie
(74) *Attorney, Agent, or Firm* — Michael Jenney; Parker Justiss, P.C.

(57) ABSTRACT

The disclosure addresses the existing gap in tubular designs and monitoring of tubulars in wellbores by considering high temperature, cyclic thermal loading effects. An example method of designing tubular for use in a well is provided that includes: (1) receiving a well configuration for a well and at least one type of well operation for the well, (2) receiving a selection of a tubular for use in the well, (3) generating a temperature history and a pressure history for the well using the well configuration, the selection of the tubular, the at least one type of well operation, and one or more simulators, and (4) determining, using the temperature history and the pressure history, a derated strength of the tubular based on one or more effects of high temperature, cyclic thermal loadings on the tubular.

20 Claims, 6 Drawing Sheets

(51) Int. Cl.
*E21B 47/07* (2012.01)
*E21B 17/00* (2006.01)

(56) References Cited

U.S. PATENT DOCUMENTS

| | | | | |
|---|---|---|---|---|
| 2014/0034390 | A1 | 2/2014 | Mitchell et al. | |
| 2014/0039797 | A1 * | 2/2014 | Gonzales | E21B 47/00 702/11 |
| 2018/0096083 | A1 * | 4/2018 | Kang | E21B 41/00 |
| 2020/0265385 | A1 * | 8/2020 | Holtz | G05B 19/4083 |
| 2021/0133367 | A1 | 5/2021 | Liu et al. | |
| 2021/0396119 | A1 | 12/2021 | Yeung et al. | |

OTHER PUBLICATIONS

Bloomfield, et al.; "Estimating Well Costs for Enhanced Geothermal System Applications"; Idaho National Laboratory Renewable Energy and Power Technologies, Idaho Falls, Idaho; Aug. 2005; 99 pgs.

Kaldal, et al.; "Structural Analysis of Casings in High Temperature Geothermal Wells in Iceland"; Proceedings of World Geothermal Congress, Melbourne, Australia; Apr. 19-25, 2015; 12 pgs.

Reinsch, et al.; "Utilizing supercritical geothermal systems: a review of past ventures and ongoing research activities"; Geothermal Energy, 5, Article No. 16(2017); 2017; 25 pgs.

"Well Deformation Mechanisms"; C-FER Technologies; https://www.cfertech.com/2020/02/22/well-deformation-mechanisms/; Feb. 22, 2020; 4 pgs.

Rahman, et al.; Book—"Casing Design—Theory and Practice"; Amsterdam—Lausanne—New York—Oxford—Shannon—Tokyo: Elsevier; Development in Petroleum Science, 42; 1995; 1 pg summary.

Willhite, et al.; "Design Criteria for Completion of Steam Injection Wells"; Journal of Petroleum Technology; Jan. 1967; 8 pgs.

Holliday; "Calculation of Allowable Maximum Casing Temperature to Prevent Tension Failures in Thermal Wells"; An ASME Publication; 1969; 8 pgs.

"Bauschinger effect"; Wikipedia; https://en.wikipedia.org/wiki/Bauschinger_effect; Aug. 20, 2021; 2 pgs.

Wang, et al.; "Effect of Temperature on Strength and Elastic Modulus of High-Strength Steel"; Journal of Materials in Civil Engineering; Feb. 2013; 10 pgs.

Kivure; "Geothermal Well Drilling Costing—A Case Study of Menengai Geothermal Field"; Presented at SDG Short Course I on Exploration and Development of Geothermal Resources; Nov. 10-31, 2016; 8 pgs.

* cited by examiner

ADVANCED TUBULAR DESIGN METHODOLOGY WITH HIGH TEMPERATURE GEOTHERMAL AND OIL/GAS CYCLIC THERMAL LOADING EFFECT

TECHNICAL FIELD

This disclosure relates to, in general, tubular designs for wellbores and, more specifically, to considering the effects of high temperature, cyclic thermal loadings on the tubular designs.

BACKGROUND

Ensuring the integrity of a wellbore during the various well operations involved in developing a completed well can be difficult. For example, a wellbore may be exposed to varying temperatures, varying pressures, formation fluids, electromagnetic radiation, varying types of minerology, and other factors that can adversely affect the material and equipment used within a wellbore. Tubular structures used within wellbores, such as casing, can assist in protecting the equipment and in supporting the wellbore against formation leakage and collapse. The tubular structures, however, are also subject to the harsh environment that is within wellbores.

SUMMARY

In one aspect, a method of designing tubular for use in a well is disclosed. In one example, the method includes: (1) receiving a well configuration for a well and at least one type of well operation for the well, (2) receiving a selection of a tubular for use in the well, (3) generating a temperature history and a pressure history for the well using the well configuration, the selection of the tubular, the at least one type of well operation, and one or more simulators, and (4) determining, using the temperature history and the pressure history, a derated strength of the tubular based on one or more effects of high temperature, cyclic thermal loadings on the tubular.

In another aspect, the disclosure provides a computing system for designing tubulars for use in a well. In one example the computing system includes: (1) an interface for receiving a well configuration for a well, and at least one type of well operation for the well, and (2) one or more processor configured to perform operations including generating a temperature history and a pressure history for the well using the well configuration, the at least one type of well operation, and a selection of a tubular for use in the well, and determining, using the temperature history and the pressure history, a derated strength of the tubular based on at least one of a Bauschinger effect, a relaxation effect, and a thermal deration effect.

In yet another aspect, the disclosure provides a computer program product. In one example, the computer program product has a series of operating instructions stored on a non-transitory computer-readable medium that directs a computing system when executed thereby to perform operations including: (1) generating a temperature history and a pressure history for a well using a well configuration, a selection of a tubular, and at least one type of well operation, and (2) determining, using the temperature history and the pressure history, a derated strength of the tubular string based on at least one of a Bauschinger effect, thermal relaxation effect, and a thermal deration effect.

In still another aspect, a method of monitoring a well is disclosed. In one example, the method of monitoring includes: (1) receiving sensor data from sensors in a wellbore, wherein the sensor data at least includes temperature data and pressure data, (2) derating, using the sensor data, a yield strength of a tubular in the wellbore based on at least one of a Bauschinger effect, thermal deration effect, and thermal stress relaxation effect, (3) determining the derated yield strength of the tubular satisfies safety factors, and (4) providing a monitoring status based on the determining

BRIEF DESCRIPTION

Reference is now made to the following descriptions taken in conjunction with the accompanying drawings, in which.

DETAILED DESCRIPTION

Figure 1:
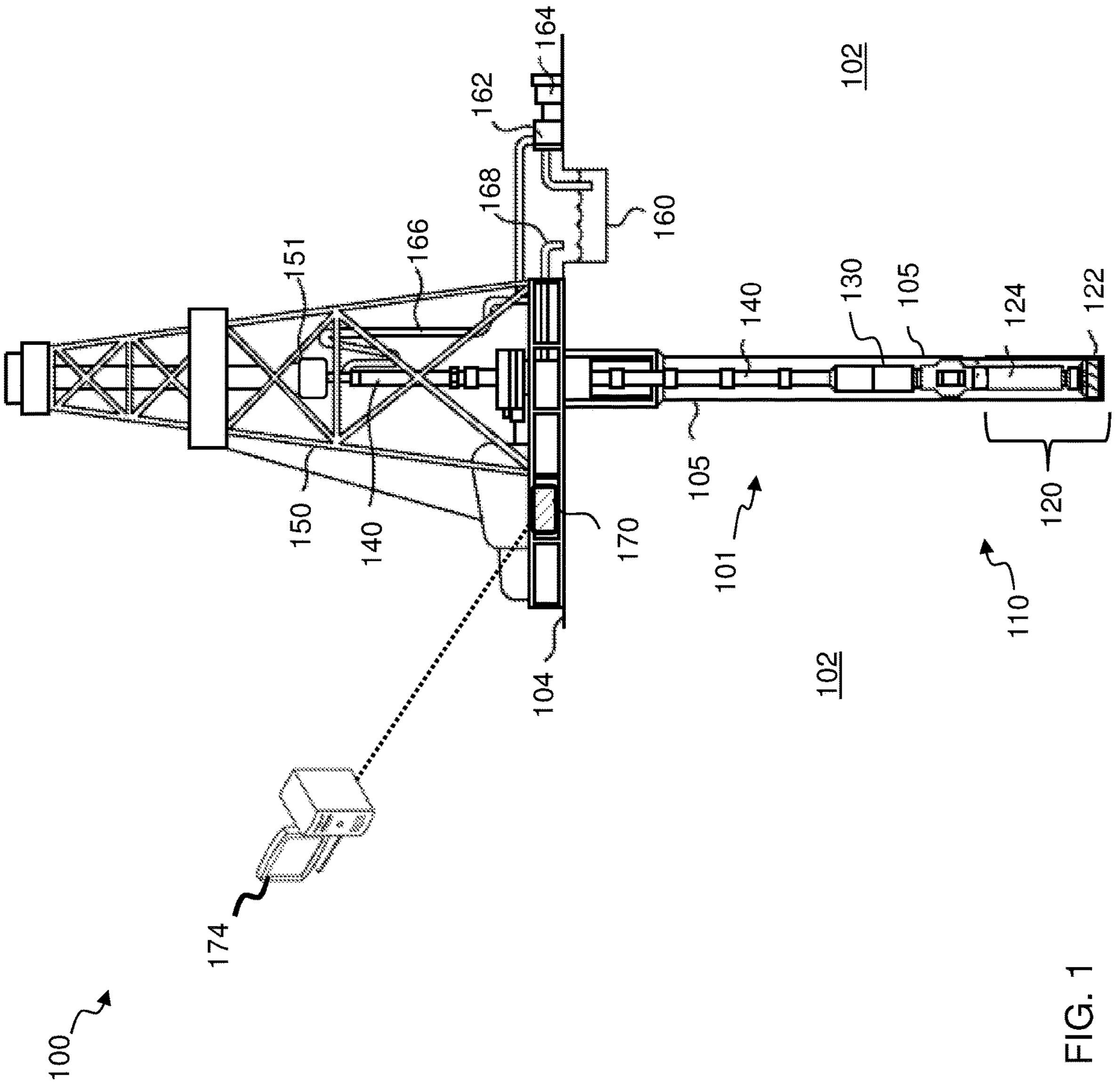
FIG. 1 illustrates a system diagram of an example of a drilling system configured to perform formation drilling to create a wellbore that includes tubulars designed according to the principles of the disclosure.

Different types of tubular structures or simply tubulars, which include casing, tubing, piping, strings (including drill strings), liners, etc., are used in the developing and operating stages of wells, such as oil, gas, or geothermal wells, and are exposed to various pressures and high temperatures that occur downhole. For example, when a high temperature well is drilled, the drill string undergoes high temperature induced stress and strength change in the body. If the temperature applied on the drill string is with cyclic thermal loading conditions, which condition can be easily encountered with a geothermal well wherein the temperature can be greater than 300 degrees Celsius, the drill string fails much earlier and quicker than expected if the effects are not well taken into account in the tubular design phase. Same behaviors apply to other strings in a well, also. Such failure can result in huge safety issues and also economic loss. Accordingly, the industry would benefit by improving the efficiency of wellbore designs by using more accurate stress analysis of the tubular structures used within wellbores.

The disclosure addresses the existing gap in tubular designs by considering high temperature, cyclic thermal loading effects. During heating of a thermal cycle there is compressive stress on a material and during cooling of the thermal cycle there is tensile stress. Applying high temperature, cyclic thermal loading effects in the design process can cause changes in the allowable stress window of tubulars and provide more robust tubulars for use in wellbores. Thermal deration of yield strength of the tubular material, the Bauschinger effect, and thermal stress relaxation are examples of effects that can be considered in the tubular design methodology for improved allowable stress windows. The disclosed tubular design methodology can be a post-yield design based on the traditional Holliday approach with the addition of considering effects due to the high temperature, cyclic loading that can occur in wells. While tubulars in geothermal wells may encounter greater high temperature, cyclic thermal loading effects than other wells, other wells, such as hydrocarbon wells, can also benefit from the disclosed improved tubular design process.

For example, a High Pressure, High Temperature (HPHT) well is known in the industry as a well with a bottom hole temperature greater than 150° C. (300° F.) and pressure control equipment with a rated working pressure of above 69 MPa (10,000 psi). With further advances in exploration, extraction, and production, some wells can even reach higher pressures and temperatures, such as Ultra HPHT (205° C., 138 MPa) wells and Extreme HPHT (260° C., 241 MPa) wells. As such, considering high temperature, cyclic thermal loading effects, such as thermal stress relaxation, thermal deration, and the Bauschinger effect, can be beneficial when designing tubulars or monitoring tubulars in wellbores.

The Bauschinger effect is a phenomenon wherein the stress-strain characteristics of a material changes due to the stress distribution at microscopic level. As a result of this phenomena, material will have a decrease in yield strength in the loading direction opposite to the pre-strain. For example, during a tensile test the stress-strain curve will follow a usual path, but during reverse loading the yielding of the material happens at a value lower than the yield stress in tension. The Bauschinger effect can be applied using a stress parameter that represents the amount of deformation in the reverse direction needed to reach the pre-stress level of stress. Equation 1 provides an example of the stress parameter:

$$\beta_{\sigma 1} = \frac{\sigma_P - \sigma_r}{\sigma_P} \qquad \text{Equation 1}$$

where $\sigma_p$ equals maximum pre-stress and $\sigma_r$ equals yield stress in the direction of reverse strain.

Thermal deration of yield strength of the material is a physical phenomena observed on most materials that when the temperature increase, the yield strength of the material decreases with the increasing of the temperature. When the temperature increase is large enough, the material yield strength would have significant decrease. If not properly considered in a design phase, a resulting tubular could fail when used in a high temperature environment, which could result in serious safety issues and huge economic loss. Temperature deration factor (TDF) can be used to apply the effect of thermal deration. TDF is defined as the ratio of the yield strength of the material at elevated temperature to the yield strength at room temperature. It is used to quantify the effect of the temperature on the yield strength of the material. Equation 2 below represents TDF.

TDF=Yield strength at elevated temperature/Yield strength at room temperature

When these effects are applied individually or combined altogether, the condition of the tubular string behavior may become much worse in a high temperature environment than if these effects are not considered, especially in a cyclic high temperature thermal condition, such as geothermal wells. In some instances, the yield strength of a material, such as for steel casing, can decrease up to 30% due to a combination of thermal deration and the Bauschinger effect.

Stress relaxation is a time-dependent decrease in stress under a constant strain, which could come from thermal expansion/shrinkage. Calculating thermal stress relaxation is different for different materials. Equation 3 below provides one example of a power expression that can be used:

$$\sigma(t) = \frac{\sigma_0}{1 - \left[1 - \left(t/t^*\right)\left(1^{1-n}\right)\right]} \qquad \text{Equation 3}$$

where $\sigma_0$ is the maximum stress at the time the loading was removed (t*), and n is a material parameter.

The disclosure provides an advanced tubular design workflow and system that considers high temperature, cyclic thermal loadings on the tubular designs. For example, at least one of thermal deration, thermal stress relaxation, and the Bauschinger effect are applied for tubular designs. A graphical user interface (GUI) can be used with one or more simulators for the tubular design process. The simulation can begin by defining a wellbore configuration having a tubular, defining a downhole well operation for the wellbore, such as drilling, fracturing, injecting, etc., and selecting the tubular. The initial tubular may change during the design process. The thermal and stress response of the tubular can be calculated based upon the wellbore configuration and operation to be performed. The effects of high temperature, cyclic thermal loadings on the tubular are also simulated and considered in the design. Trapped annular pressure buildup of the wellbore may then be determined and considered. A stress analysis can then be performed considering the effects and pressures. As a result of this analysis, an optimal tubular design may be analyzed or determined.

In addition to designing, the disclosure also recognizes that considering the high temperature, cyclic thermal loading effects can also be used for monitoring of wells. The effects can be used for real time analysis of well integrity or failures using sensor data from downhole sensors. As such, the disclosed high temperature, cyclic thermal loading effects can also be used for real time monitoring, such in drilling system 100 of FIG. 1.

Turning now to the figures, FIG. 1 illustrates a diagram of an example of a drilling system 100 including tubulars that can be designed according to the principles of the disclosure. Drilling system 100, or simply system 100, is configured to perform formation drilling to create a wellbore 101 within the subterranean formation of the earth 102. Wellbore 101 is supported by casing 105, which provides a barrier between the subterranean formation 102 and the fluids and material internal to wellbore 101. System 100 can be, for example, a logging while drilling (LWD) system, a measuring while drilling (MWD) system, a seismic while drilling (SWD) system, or a telemetry while drilling (TWD) system. System 100 can be for a hydrocarbon well, such as oil or gas, a geothermal well, or another type of wellbore under high temperature, cyclic thermal conditions during the lifecycle of the well. FIG. 1 depicts an onshore operation. Those skilled in the art will understand that the disclosure is equally well suited for use in offshore operations or onshore operations. Additionally, in addition to the example of a drilling system, the disclosure is also well suited for other well operations, such as wireline operations, fracking, and completed wells.

System 100 includes BHA 110 that includes drilling tool 120 operatively coupled to tool string 130, which may be moved axially within wellbore 101. BHA 110 can include other components or tools, such as a local power supply (e.g., generators, batteries, or capacitors), telemetry systems, sensors, transceivers, and control systems. Drilling tool 120 includes drill bit 122 and drilling controller 124 that can provide directional control of drill bit 122. BHA 110 is positioned or otherwise arranged at the bottom of drill string 140, which is extended into the subterranean formation 102 from derrick 150 arranged at the surface 104. System 100 includes top drive 151 that is used to rotate the drill string 140 at the surface 104, which then rotates drill bit 124 into the earth to thereby create wellbore 101. Operation of top drive 151 is controlled by a top drive controller. System 100 can also include a kelly and a traveling block that is used to lower and raise drill string 140 within wellbore 101.

Fluid or "drilling mud" from a mud tank 160 is pumped downhole using a mud pump 162 powered by an adjacent power source, such as a prime mover or motor 164. The drilling mud is pumped from mud tank 160, through a stand pipe 166, which feeds the drilling mud into drill string 140 and conveys the same to the drill bit 124. The drilling mud exits one or more nozzles arranged in the drill bit 124 and in the process cools the drill bit 124. After exiting the drill bit 124, the mud circulates back to the surface 104 via the annulus defined between the wellbore 101 and the drill string 140, and in the process, returns drill cuttings and debris to the surface 104. The cuttings and mud mixture are passed through a flow line 168 and are processed such that a cleaned mud is returned down hole through the stand pipe 166 once again.

The system 100 also includes a well site controller 170, and a computing system 174, which can be communicatively coupled to well site controller 170. Well site controller 170 includes one or more processors and one or more memory, and is configured to direct operation of the system 100.

Well site controller 170 or computing system 174, can be utilized to communicate with downhole tools of drilling tool 120 and tool string 130, such as sending and receiving telemetry, data, drilling sensor data, instructions, and other information, including but not limited to collected or measured parameters, location within wellbore 101, and cuttings information. A communication channel may be established by using, for example, electrical signals, mud pulse telemetry, or another type of telemetry between the drilling tool 120 and tool string 130 to well site controller 170.

Computing system 174 can be proximate well site controller 170 or be distant, such as in a cloud environment, a data center, a lab, or a corporate office. Computing system 174 can be a laptop, smartphone, personal digital assistant (PDA), server, desktop computer, cloud computing system, other computing systems, or a combination thereof, that are operable to perform the processes and methods described herein. Well site operators, engineers, and other personnel can send and receive data, instructions, measurements, and other information by various conventional means with computing system 174 or well site controller 170. Computing system 174 can be used to design tubulars, such as casing 105 and drill string 140, as disclosed herein. For example, casing 105 and drill string 140 can be the result of designs generated by computing system 174 that derated yield strengths according to effects of high temperature, cyclic thermal loadings within wellbore 101. By considering such effects, replacing casing sections of casing 105 and trip-ins and trip-outs of drill string 140 can be reduced. Well site controller 170 can also consider the effects of high temperature, cyclic thermal loadings within wellbore 101 for real time monitoring of the integrity of tubulars in the wellbore 101. Real time data from downhole sensors, such as temperature, pressure, and strain sensors can be considered for derating the yield strength of tubulars in the well bore 101 for monitoring. The monitoring can be in real time and possibly reduce costly downhole failure of tubulars.

Figure 2:
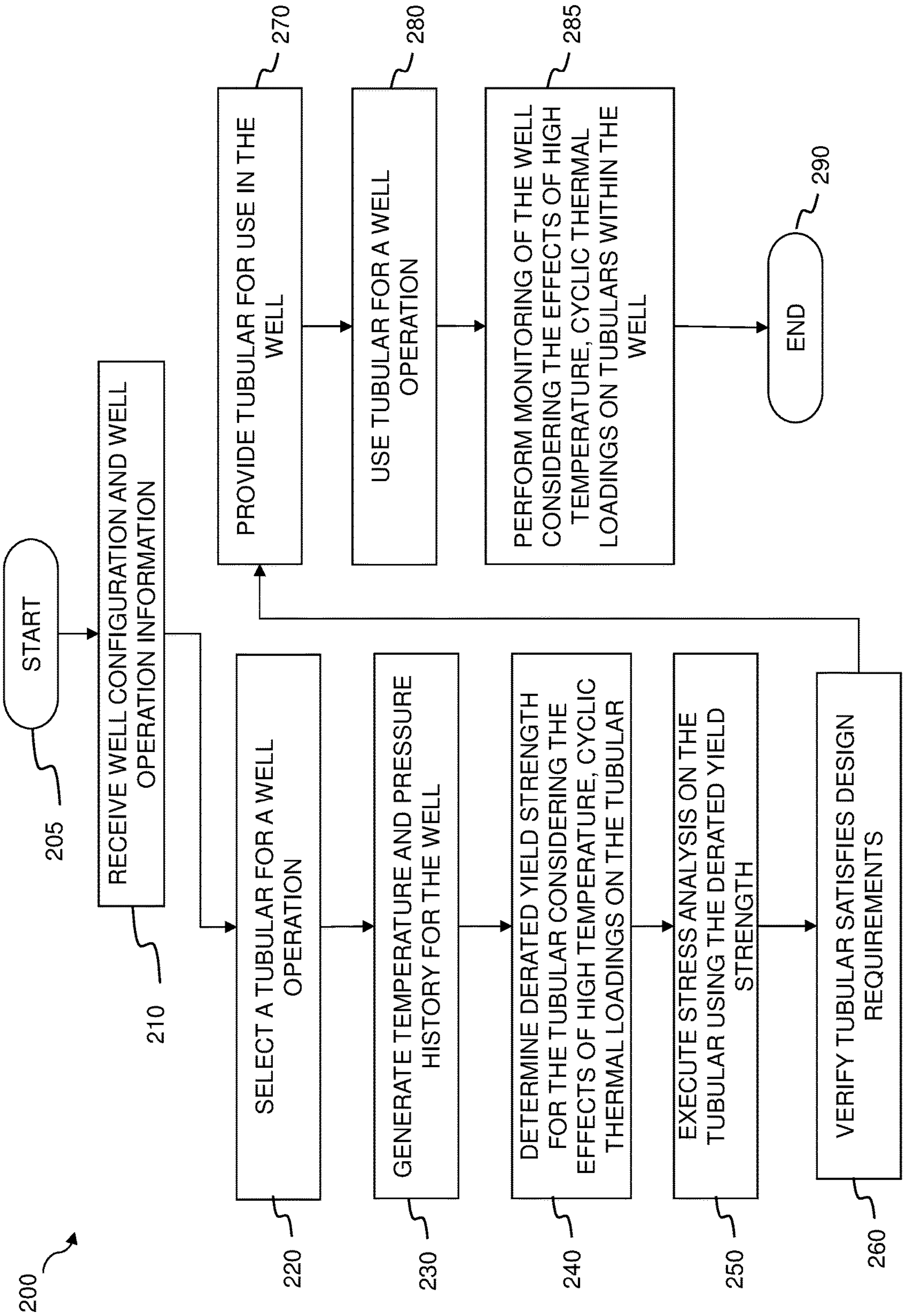
FIG. 2 illustrates a flow diagram of an example method of performing a well operation in a wellbore using a tubular designed according to the principles of the disclosure.

FIG. 2 illustrates a flow diagram of an example method 200 of performing a well operation in a wellbore using a tubular designed according to the principles of the disclosure. At least a portion of method 200 can be performed by a tubular design system implemented on one or more processors of a computing system. Method 200 can use one or more simulators of the tubular design computing system to simulate temperature and pressure in a wellbore and stress on tubulars in the wellbore. A user, such as an engineer or designer, can input data for the simulations using a GUI. Another type of input interface or input device, such as a mouse or keyboard, can also be used. In addition to manual inputs, data may also be automatically provided from a database storing the data. Method 200 begins in step 205.

In step 210, a well configuration for a well and at least one well operation for the well are received. The well configuration at least includes the well path and subterranean formation information. The well configuration can also include other downhole information of the wellbore including the number of strings, casing and hole dimensions, fluids behind each string, cement types, and temperatures, such as geothermal temperatures. The well operation can be, for example, drilling, such as the example of FIG. 1, production, circulation, workover, logging, cementing, running casing, and/or trip in/out tubing, or another type of well operation that can be defined for the wellbore. Multiple well operations can be defined. For example, well operations over the service life of the well can be identified.

A selection of a tubular for use in the well is received in step 220. The tubular can be selected from a database that includes preexisting designs of multiple types of tubulars for different types of wells. A user can manually select the tubular. Various options for a tubular could be automatically provided based on the well configuration and at least one well operation, which the user can select. A tubular can also be automatically selected based on the well configuration and at least one well operation. The tubular can be selected for use in more than one well operation. For example, casing can be selected for the service life of the well, which can include multiple well operations. Associated with the tubular are the various characteristics that, for example, include size, weight, rating, material, thermal property, and design factors for the safety factors.

In step 230, a temperature history and a pressure history are generated for the well using the well configuration and the well operation. A thermal simulator and a hydraulic simulator can be used to generate models for the temperature and the pressure, respectively, and can cooperate to generate the temperature and pressure models. The simulation can provide the temperature history profile on the tubular that includes initial temperature, final temperature, and the cyclic temperature history on the tubular. The simulation can also provide the pressure history profile on the tubular as the pressure environment changes in the wellbore for the different well operations.

A derated yield strength for the tubular is determined in step 240 using the temperature history and the pressure history, and also considering the effects of high temperature, cyclic thermal loadings on the tubular. One or more of thermal stress relaxation, Bauschinger effect and thermal deration effect can be applied to the tubular for simulating the effects of high temperature, cyclic thermal loadings. All three or a combination of two can be applied for determining the derated yield strength. Other effects may also be applied to capture the derating of yield strength due to high temperature, cyclic thermal loading.

A stress analysis of the tubular using the derated yield strength is executed in step 250. A stress simulator can provide the stress analysis by simulating the stresses on the tubular caused by changes in the load, and temperature and pressure conditions affecting the tubular. For example, the stress analysis can consider such factors as trapped annular pressure build-up, multi-string analysis, single string analysis, and other types of mechanical loads applied on the tubular for various types of well operations.

In step 260, method 200 continues with verification that the tubular satisfies design requirements for the well based on the stress analysis. The design requirements include the design factors and design optimizations. Calculated design factors from the simulation can be compared to the received design factors associated with the tubular for verification. A design optimization is a factor to consider for determining if a resulting tubular design needs to be optimized. For example, a least cost analysis can be performed to determine if another acceptable tubular design could be used at a lower cost. Other optimizations to consider are weight and space in some limited space conditions.

When design requirements are satisfied, the tubular is provided for use in the well in step 270. Accordingly, the parameters of the tubular are output for use in one or more well operation. The parameters include, for example, safety factors, design limits, and loads for the tubular. In step 280, the designed tubular is used in a well operation. The tubular can be used in multiple well operations within the wellbore. For example, the tubular can be casing that is used for drilling and completion.

In step 285, monitoring of the wellbore is performed considering the effect or effects of high thermal, cyclic thermal loadings. The monitoring can be in real time using sensor data obtained from the wellbore during various well operations. A derated yield strength of a tubular in the wellbore can be determined using the sensor data, such as temperature and pressure data, and the effects of high temperature, cyclic thermal loading. A stress analysis can be performed based on the derated strength and can be used to determine a status of the tubular. A well site controller, such as well site controller 170, can be used for the monitoring and the status can be displayed on a screen of the well site controller 170. Well formation and configuration information can be used with the sensor data for monitoring. The method 200 continues to step 290 and ends.

Figure 3A:
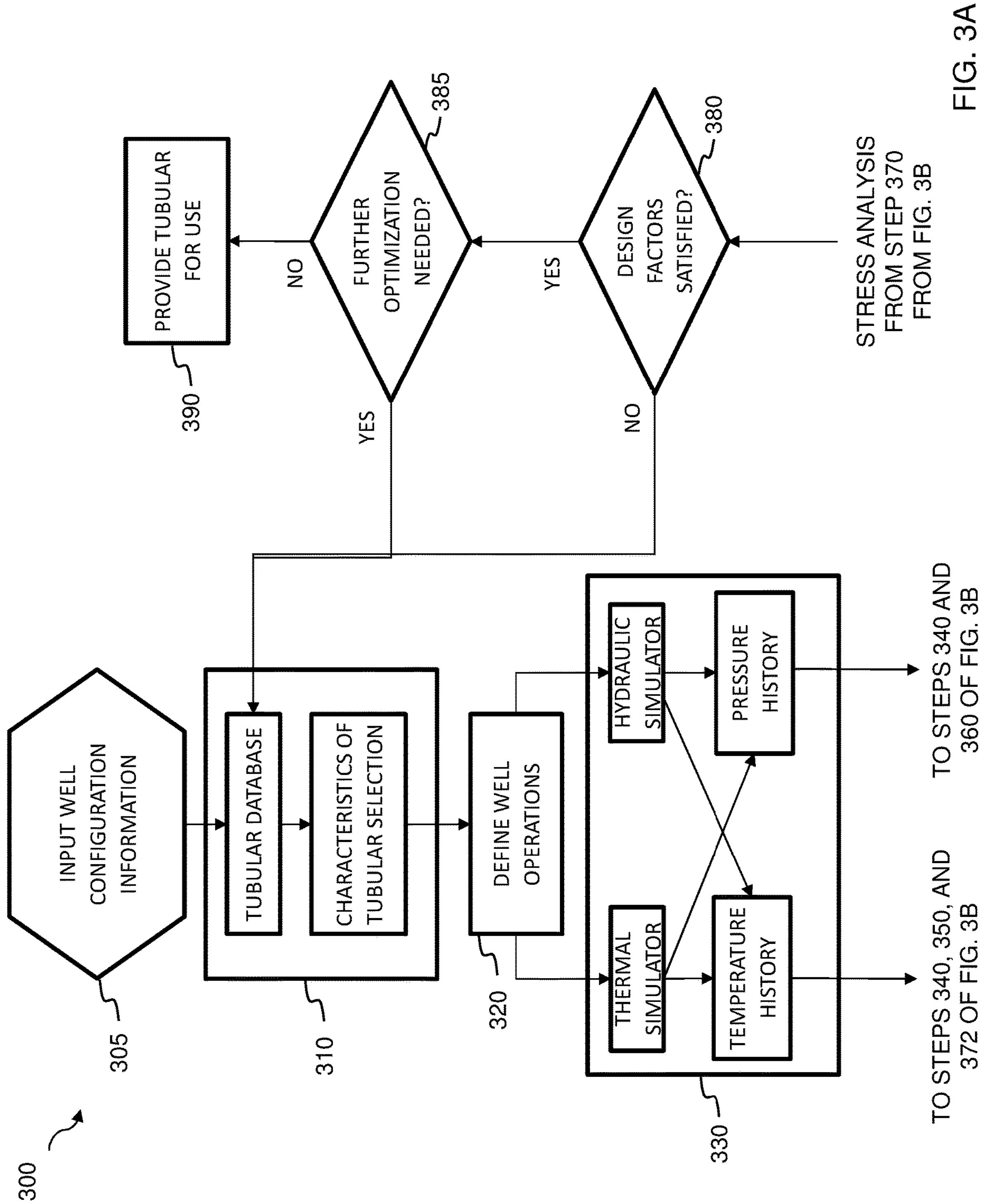
FIGS. 3A and 3B illustrate a flow diagram of an example workflow for designing tubulars according to the principles of the disclosure.
Figure 3B:
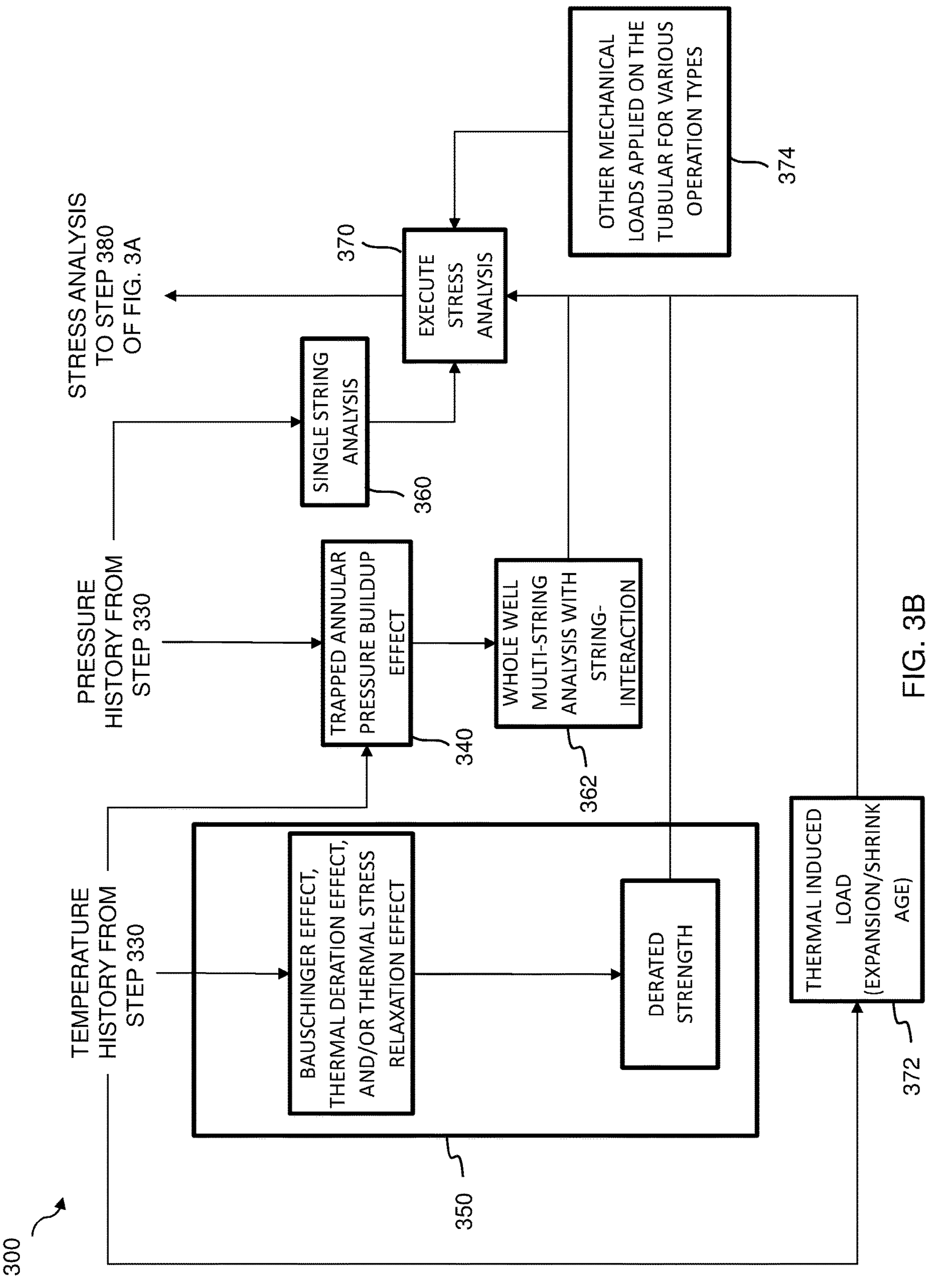

FIGS. 3A and 3B illustrate a flow diagram of an example of a workflow 300 for designing tubulars for use in a well according to the principles of the disclosure. The well can be, for example a geothermal well. As with method 200, one or more simulators can be used for the workflow 300 and a GUI can be used to input at least some of the information.

Workflow 300 begins in step 305 with inputting the well configuration information. The well configuration information can include, for example, the well path, the formation related information, such as the pore pressure and the fracture pressure gradient, geothermal gradient, the well hole profile, etc.

Once the well configuration information is obtained, a tubular selection is made in step 310 from a tubular database. A rough design of the planned casing seat depth for the well can also considered when selecting the tubular. The tubular database includes existing tubulars with characteristics, such as casing/tubing size, weight, rating, material, thermal properties, etc. Both the tubular database and the corresponding characteristics are represented in step 310 of FIG. 3. At this point in workflow 300, a tubular or tubular system for the well can be roughly designed but needs to be evaluated to verify the tubular meets the design requirements.

In step 320, well operations for the well are defined. The well operations can be defined over the service life of the well. The well operations can include, for example, drilling, production, circulation, workover, etc.

In step 330, the well operations are applied to the tubular, i.e., tubular characteristics, for simulation. One or more simulators can be used to model thermal and pressure effects on the tubular in the wellbore during well operations. A thermal simulator can be used for thermal simulation using the well configuration information, the tubular characteristics, and the well operation. The thermal simulation provides a temperature history profile for the tubular that includes, for example, the initial temperature, final temperature, and the cyclic temperature history. Accordingly, the thermal simulator can calculate the temperature history on the tubular over its service life in the wellbore.

During the service life cycle of the well, the tubulars also experience various pressure environments in the well for the different types of well operations, such as, drilling, circulation, production, and workover operations. Accordingly, a hydraulic simulator can be used for pressure simulation using the well configuration information, the tubular characteristics, and the well operation. The pressure simulation provides a pressure history profile for the tubular in the wellbore. The hydraulic simulator and the thermal simulator can work together for the thermal and hydraulic simulations as the hydraulic and thermal phenomenon affect each other.

Once the temperature and pressure effect are obtained via the history of the temperature and pressure profiles, the temperature effect and pressure effect are used to perform a stress analysis of the tubular. Additional effects on the tubing can also be determined to use for the stress analysis. In step 340 the effect of trapped annular pressure buildup in the wellbore is determined using the temperature and pressure history. In step 350 the effect of high temperature, cyclic thermal loading is applied to the tubular. One or more of the Bauschinger effect, thermal stress relaxation, and thermal deration effect can be applied to the tubular. Different combination of the effects can be applied. Applying one or more of the effects decreases the yield strength of the tubular resulting in a derated yield strength, which can then be considered for the stress analysis.

The stress analysis can consider stress analysis for each string through a single string analysis method in step 360 and a multi-string analysis method in step 362. In the single string method 360, the tubular is treated as only one tubular and the interaction between other tubulars is ignored. In multi-string analysis method 362, the whole well tubulars are treated as a system and the interaction between components of the system are considered, such as tubular-tubular interaction, and the trapped annular pressure buildup effect from step 340.

The stress analysis for the tubular is executed in step 370. A stress simulator can be used to simulate the stress analysis. The stress simulator can consider the single string analysis of step 360 and the whole well string analysis of step 362 for the stress analysis. Additionally, the stress simulator can consider the derated strength from step 350 that was calculated by applying the Bauschinger effect and the thermal deration effect to the tubular. The stress simulator can also consider thermal induced load (such as thermal expansion and/or shrinkage induced load) on the tubular simulated in step 372 and other mechanical loads from step 374 that can be applied to the tubular during the different type of well operations.

The stress analysis executed in step 370 provide the results of various safety factors (e.g., axial safety factor (compression and tension), API burst safety factor, API collapse safety factor, envelope safety factor, triaxial safety factor, etc.), design limit envelop, axial load along the strings, etc. to evaluate the safety of the tubular over the service life of the tubular. Advantageously, the derated strength due to the Bauschinger effect and thermal deration can be taken into account for the stress analysis and finally reflected in the safety factors.

In step 380 a determination is made if the design factors are satisfied. For a tubular design, each safety factor has its corresponding design factor requirement/recommendation. For example, the American Petroleum Institute (API) burst safety factor has an API burst design factor requirement/recommendation. The calculated safety factors are compared with the corresponding design factors in step 380 to check whether the tubular design meets the corresponding design factors. If any of the safety factors are not satisfied, then a re-design process would be needed in order to meet all the design requirements and method 300 continues to step 310. If all of the design factors are satisfied, method 300 continues to step 385 where a determination is made if further optimization of the tubular design is needed. For example, even when the tubular design meets all the safety requirements, a further optimization cycle may also be performed in order to obtain an optimized design, such as to reduce the cost.

When further optimization is needed, method 300 continues to step 310. When further optimization is not needed, method 300 continues to step 390 and provides the tubular for use in one or more well operations in the wellbore. As such, well operations can be executed using the tubular design from method 300. With step 390, the various characteristics of the tubular are provided as an output of method 300. The characteristics can include, for example, various safety factors, length change, load along the string, and max wear allowance.

Figure 4:
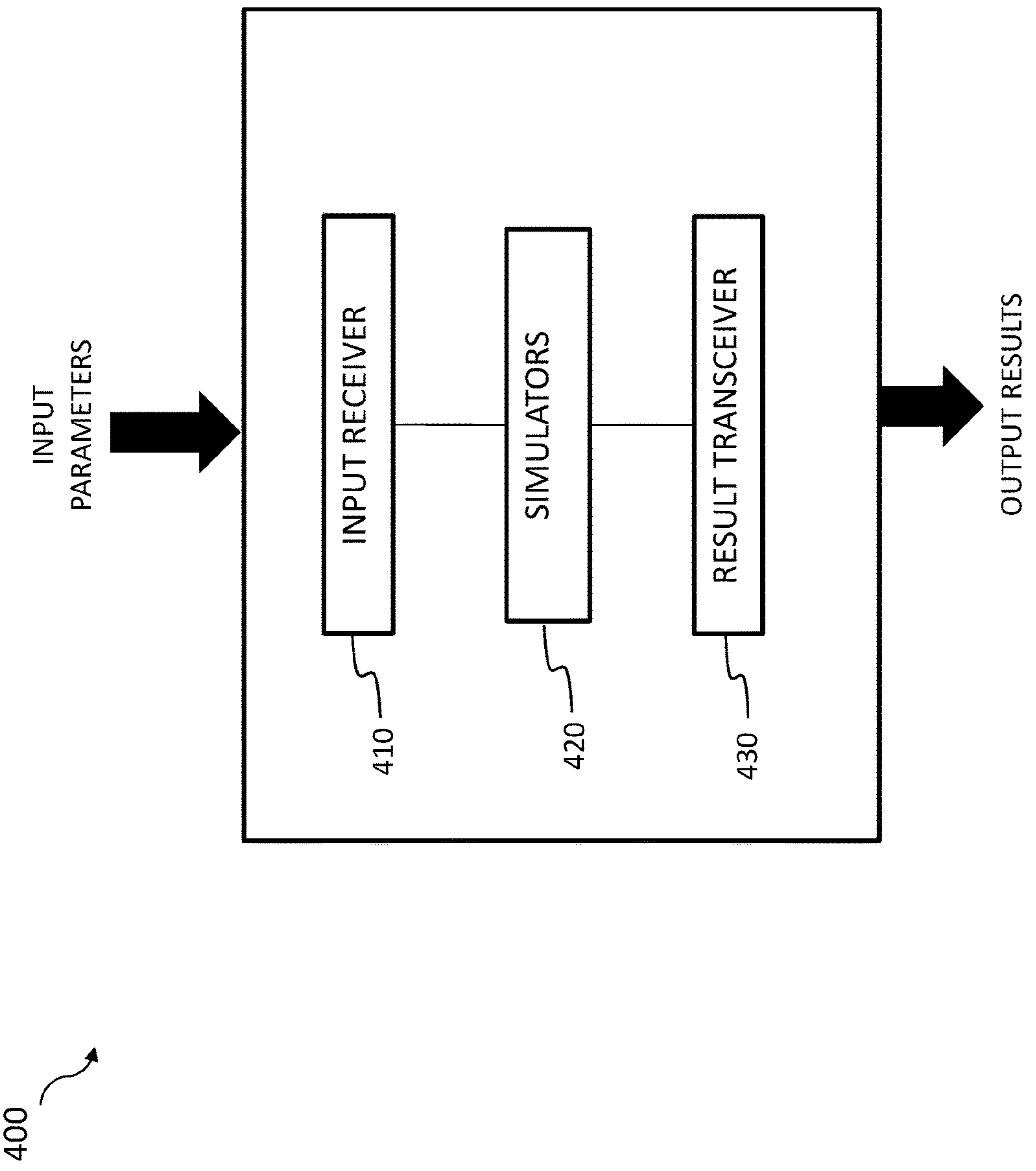
FIG. 4 illustrates a functional block diagram of an example tubular design system constructed according to the principles of the disclosure.

FIG. 4 illustrates a functional block diagram of an example tubular design system 400 constructed according to the principles of the disclosure. Tubular design system 400 is configured to provide a tubular for use in a wellbore that has been designed with a derated yield strength based on high temperature, cyclic thermal loadings. The tubular design system 400 can generate a tubular design according to, for example, method 200 or method 300 as disclosed herein. Tubular design system 400, or a portion thereof, can be implemented as an application, a code library, a dynamic link library, a function, a module, other software implementation, or combinations thereof. Tubular design system 400 can be implemented on software, hardware, or a combination thereof. The tubular design system 400 can be implemented using one or more computing systems, such as computing system 500 of FIG. 5.

Tubular design system 400 has an input receiver 410, simulators 420 and a result transceiver 430. A memory or data storage of associated with tubular design system 400 can be configured to store algorithms for directing the operations thereof.

Input receiver 410 is configured to receive inputs for generating a tubular design. The inputs can include configuration information for the well, well operations for the well, and a selection of a tubular as an initial design. The input receiver 410 can be a GUI that allows selections of the input information from multiple examples. For example, the tubular can be selected from a tubular database using a GUI. The tubular databased can be part of the tubular design system 400.

Simulators 420 can be configured to analyze the effects of temperature, pressure, and stress on the tubular to determine if the selected tubular design satisfies design factors. The simulators can include a thermal simulator for simulating a temperature history profile, a hydraulic simulator for simulating a pressure history profile, and a stress simulator for analyzing stress on the tubular. The stress analysis by the stress simulator includes using a derated strength of the tubular due to high temperature, cyclic thermal loading. The effects of at least one of the Bauschinger effect, thermal stress relaxation, and thermal deration effect can be applied on the tubular for generating the derated strength. The simulators provide an approved tubular design that can be output by the result transceiver 430. An approved design has at least satisfied the design factors. Additionally, the approved design may also need no further optimization. Simulators 420 can operate according to the simulations of methods 200 or 300.

Results transceiver 430 can send the results from tubular design system 400 to another system or user for use in one or more well operations. For example the tubular design system 400 can generate a casing design to use for well operations in a well. The casing design can be used as an input into a well planning system for developing and operating a well. The casing design can also be visually displayed on a screen for use by a user.

Figure 5:
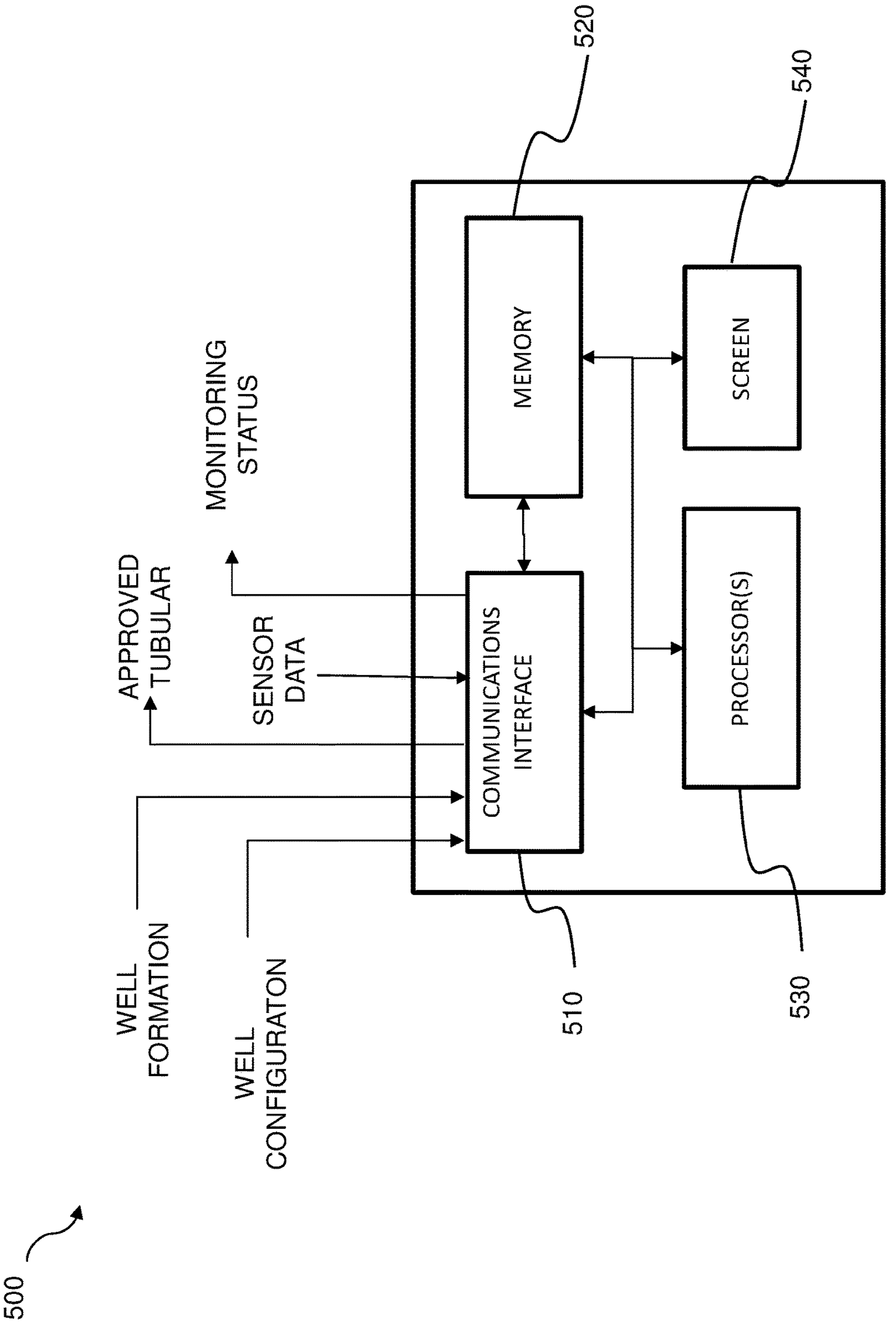
FIG. 5 illustrates a block diagram of an example of a computing system 500 for use according to the principles of the disclosure.

FIG. 5 illustrates a block diagram of an example of a computing system 500 for designing tubulars or monitoring a wellbore according to the principles of the disclosure. Computing system 500 can be located proximate a well site, or a distance from the well site, such as in a data center, cloud environment, corporate location, a lab environment, or another location. The computing system can be a distributed system having a portion located proximate a well site and a portion located remotely from the well site. Tubular design system 400 can be implemented on computing system 500. Computing system 500 includes a communications interface 510, a memory (or data storage) 520, and one or more processors 530, and a screen 540.

Communications interface 510 is configured to transmit and receive data. For example, communications interface 510 can receive inputs for designing a tubular. The inputs can include well configuration information, well formation information, and a tubular selection. The tubular selection can be from a tubular database stored on, for example, memory 520. Communications interface 510 can also transmit an approved tubular design that can be used in well operations of a wellbore. Communications interface 510 can communicate (transmit and receive) via communication systems used in the industry. For example, wireless or wired protocols can be used. Communication interface 510 is capable of performing the operations as described for input receiver 410 and result transceiver 430.

Computing system 500 provides an example of well site controller 170 or computing system 174. As such, communication interface 510 can also receive sensor data from a well bore for real time monitoring.

Memory 520 can be configured to store a series of operating instructions that direct the operation of the one or more processors 530 when initiated thereby, including the code representing the algorithms for simulating temperature, pressure, and stress effects on a tubular such as disclosed in methods 200 or 300, which can include applying one, two, or all three of the Bauschinger effect, thermal stress relaxation, and thermal deration effect to the tubular for determining a derated yield strength. Code for employing sensor data in real time monitoring using one or more of the high temperature, cyclic thermal loading effects can also be stored on the memory. Memory 520 is a non-transitory computer readable medium. Memory 520 can be a distributed memory.

The one or more processors 530 are configured to determine an approved tubular for well operations in the wellbore using a derated yield strength. The one or more processors can also be configured for real time monitoring. The one or more processors 530 include the logic to communicate with communications interface 510 and memory 520, and perform the functions described herein to consider high temperature, cyclic thermal loadings on tubular when designing or monitoring. The one or more processors 530 can generate a monitoring status based on a derated strength of a tubular in a wellbore using sensor data, such as real time sensor data, from sensors associated with the wellbore.

Screen 540 is configured to display outputs from the one or more processors 530, such as approved tubular designs. Screen 540 can also display a monitoring status. Accordingly, the computing system 500 can output approved tubular designs to other well systems and/or can display the tubular designs. In other examples, the computing system 500 can a monitoring status to other well systems and/or can display the monitoring status. The monitoring status can be based on a comparison of a derated yield strength of a downhole tubular to a desired operating strength or safety factors. An alert can be displayed on the screen 540 when, for example, safety factors are not satisfied.

A portion of the above-described apparatus, systems or methods may be embodied in or performed by various analog or digital data processors, wherein the processors are programmed or store executable programs of sequences of software instructions to perform one or more of the steps of the methods. A processor may be, for example, a programmable logic device such as a programmable array logic (PAL), a generic array logic (GAL), a field programmable gate arrays (FPGA), or another type of computer processing device (CPD). The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed examples or embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floppy disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, because the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

Aspects disclosed herein include:

A. A method of designing tubular for use in a well, comprising: (1) receiving a well configuration for a well and at least one type of well operation for the well, (2) receiving a selection of a tubular for use in the well, (3) generating a temperature history and a pressure history for the well using the well configuration, the selection of the tubular, the at least one type of well operation, and one or more simulators, and (4) determining, using the temperature history and the pressure history, a derated strength of the tubular based on one or more effects of high temperature, cyclic thermal loadings on the tubular.

B. A computing system for designing tubulars for use in a well, comprising: (1) an interface for receiving a well configuration for a well, and at least one type of well operation for the well, and (2) one or more processor configured to perform operations including generating a temperature history and a pressure history for the well using the well configuration, the at least one type of well operation, and a selection of a tubular for use in the well, and determining, using the temperature history and the pressure history, a derated strength of the tubular based on at least one of a Bauschinger effect, a relaxation effect, and a thermal deration effect.

C. A computer program product having a series of operating instructions stored on a non-transitory computer-readable medium that directs a computing system when executed thereby to perform operations including: (1) generating a temperature history and a pressure history for a well using a well configuration, a selection of a tubular, and at least one type of well operation, and (2) determining, using the temperature history and the pressure history, a derated strength of the tubular string based on at least one of a Bauschinger effect, thermal relaxation effect, and a thermal deration effect.

D. A method of monitoring a well, comprising: (1) receiving sensor data from sensors in a wellbore, wherein the sensor data at least includes temperature data and pressure data, (2) derating, using the sensor data, a yield strength of a tubular in the wellbore based on at least one of a Bauschinger effect, thermal deration effect, and thermal stress relaxation effect, (3) determining the derated yield strength of the tubular satisfies safety factors, and (4) providing a monitoring status based on the determining.

Each of aspects A, B, C, and D can have one or more of the following additional elements in combination. Element 1: wherein the one or more effects include at least one of a Bauschinger effect, thermal stress relaxation, and a thermal deration effect. Element 2: wherein the determining is based on at least two of the Bauschinger effect, the thermal stress relaxation, and the thermal deration effect. Element 3: further comprising generating a stress analysis of the tubular based on the derated strength. Element 4: further comprising verifying the tubular satisfies design requirements for the well based on the stress analysis. Element 5: further comprising receiving another selection for the tubular when the design requirements are not satisfied and providing the tubular for operating in the well when the design requirements are satisfied. Element 6: wherein the design requirements include at least one of design factors and design optimizations. Element 7: wherein generating the stress analysis further includes considering a whole well multi-string analysis of the tubular and a single string analysis of the tubular. Element 8 wherein the whole well multi-string analysis considers a trapped annular pressure buildup effect in the well. Element 9: wherein the one or more simulators includes a thermal simulator for generating the temperature history and a hydraulic simulator for generating the pressure history, and a stress simulator for generating the stress analysis. Element 10: wherein the receiving the well configuration, the at least one type of well operation, and the selection of the tubular is via a graphical user interface. Element 11: wherein the operations further include generating a stress analysis of the tubular based on the derated strength. Element 12: wherein generating the stress analysis further includes considering a whole well multi-string analysis of the tubular and a single string analysis of the tubular. Element 13: wherein the whole well multi-string analysis considers a trapped annular pressure buildup effect in the well. Element 14: wherein the operations further include verifying the tubular satisfies design factors. Element 15: wherein the operations further include verifying the tubular satisfies design optimizations. Element 16: further comprising a memory that stores a tubular database and the operations further include selecting the tubular from the tubular database.

What is claimed is:

1. A method of designing tubular for use in a well, comprising:

receiving a well configuration for a well and at least one type of well operation for the well;

receiving a selection of a tubular for use in the well;

generating a temperature history and a pressure history for the well using the well configuration, the selection of the tubular, the at least one type of well operation, and one or more simulators; and determining, using the temperature history and the pressure history, a derated strength of the tubular based on one or more effects of high temperature, cyclic thermal loadings on the tubular for monitoring tubulars in real time to reduce downhole failure of the tubulars, wherein the one or more effects include a Bauschinger effect.

2. The method as recited in claim 1, wherein the one or more effects include the Bauschinger effect and at least one of thermal stress relaxation or a thermal deration effect.

3. The method as recited in claim 1, further comprising generating a stress analysis of the tubular based on the derated strength.

4. The method as recited in claim 1, wherein the one or more simulators includes a thermal simulator for generating the temperature history and a hydraulic simulator for generating the pressure history, and a stress simulator for generating the stress analysis, wherein the thermal and the hydraulic simulators cooperate when generating the temperature history and the pressure history.

5. The method as recited in claim 1, wherein the receiving the well configuration, the at least one type of well operation, and the selection of the tubular is via a graphical user interface.

6. The method as recited in claim 3, further comprising verifying the tubular satisfies design requirements for the well based on the stress analysis.

7. The method as recited in claim 3, wherein generating the stress analysis further includes considering a whole well multi-string analysis of the tubular and a single string analysis of the tubular, wherein the whole well multi-string analysis considers a trapped annular pressure buildup effect in the well.

8. The method as recited in claim 6, further comprising receiving another selection for the tubular when the design requirements are not satisfied and using the tubular for operating in the well when the design requirements are satisfied.

9. The method as recited in claim 6, wherein the design requirements include at least one of design factors and design optimizations.

10. A computing system for designing tubulars for use in a well, comprising:

an interface for receiving a well configuration for a well, at least one type of well operation for the well; and one or more processor configured to perform operations including:

generating a temperature history and a pressure history for the well using the well configuration, the at least one type of well operation, and a selection of a tubular for use in the well; and determining, using the temperature history and the pressure history, a derated strength of the tubular to monitor tubulars in real time and reduce downhole failures of the tubulars, wherein the determining is based on a Bauschinger effect and at least one of a thermal stress relaxation effect or a thermal deration effect.

11. The computer system as recited in claim 10, wherein the operations further include generating a stress analysis of the tubular based on the derated strength.

12. The computer system as recited in claim 10, wherein the operations further include verifying the tubular satisfies design factors.

13. The computer system as recited in claim 10, wherein the operations further include verifying the tubular satisfies design optimizations.

14. The computer system as recited in claim 10, further comprising a memory that stores a tubular database and the operations further include selecting the tubular from the tubular database.

15. The computer system as recited in claim 11, wherein generating the stress analysis further includes considering a whole well multi-string analysis of the tubular and a single string analysis of the tubular.

16. The computer system as recited in claim 15, wherein the whole well multi-string analysis considers a trapped annular pressure buildup effect in the well.

17. A computer program product having a series of operating instructions stored on a non-transitory computer-readable medium that directs one or more processors when executed thereby to perform operations, the operations comprising:

simulating a temperature history and a pressure history for a well using a well configuration, a selection of a tubular, and at least one type of well operation; and determining, using the temperature history and the pressure history, a derated strength of the tubular string based on a Bauschinger effect and at least one of a thermal stress relaxation effect or a thermal deration effect for monitoring tubulars in real time to reduce downhole failure of the tubulars.

18. The computer program product as recited in claim 17, wherein the determining is based on the Bauschinger effect and the thermal stress relaxation effect.

19. A method of monitoring a well having tubulars, comprising:

receiving sensor data from sensors in a wellbore, wherein the sensor data at least includes temperature data and pressure data;

derating, using the sensor data, a yield strength of a tubular in the wellbore based on a Bauschinger effect and at least one of a thermal deration effect or a thermal stress relaxation effect;

determining the derated yield strength of the tubular satisfies safety factors; and providing a monitoring status on a screen based on the determining for real time monitoring of the tubulars to reduce failures of the tubulars.

20. The method as recited in claim 19, generating an alert when one or more of the safety factors is unsatisfied.

* * * * *